United States Patent
Shuto

(10) Patent No.: US 6,313,491 B1
(45) Date of Patent: Nov. 6, 2001

(54) SEMICONDUCTOR MEMORY HAVING CELL INCLUDING TRANSISTOR AND FERROELECTRIC CAPACITOR

(75) Inventor: Susumu Shuto, Yokohama (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 0 days.

(21) Appl. No.: 09/354,101

(22) Filed: Jul. 15, 1999

(30) Foreign Application Priority Data

Jul. 17, 1998 (JP) .................................................. 10-202979

(51) Int. Cl.[7] .......................... H01L 27/108; H01L 29/78; H01L 31/062; H01L 29/76; H01L 29/94
(52) U.S. Cl. .......................... 257/295; 257/296; 257/774; 257/298; 257/300; 257/311; 257/303; 361/321.4; 361/322; 361/149
(58) Field of Search .................................... 257/295, 296, 257/303, 306, 311, 773, 774, 300; 438/240, 3, 655, 210, 241, 253, 643, 618; 361/321.4, 322, 149

(56) References Cited

U.S. PATENT DOCUMENTS

| | | | |
|---|---|---|---|
| 5,801,410 | * 9/1998 | Kim | 257/295 |
| 5,936,832 | * 8/1999 | Saito et al. | 361/321.4 |
| 5,990,507 | * 11/1999 | Mochizuki et al. | 257/295 |
| 6,004,839 | * 12/1999 | Hayashi et al. | 438/210 |
| 6,022,774 | * 2/2000 | Kawai et al. | 438/240 |
| 6,080,616 | * 6/2000 | Kim | 438/239 |
| 6,090,697 | * 7/2000 | King et al. | 438/618 |
| 6,121,649 | * 9/2000 | Kunishima | 257/295 |

* cited by examiner

Primary Examiner—Alexander O. Williams
(74) Attorney, Agent, or Firm—Banner & Witcoff Ltd.

(57) ABSTRACT

An upper electrode of an FRAM capacitor is connected to a diffusion layer on the surface of a semiconductor substrate via a contact hole, second interconnecting layer, contact hole, first interconnecting layer, and contact hole. The first interconnecting layer is formed at substantially the same level as the FRAM capacitor. This decreases the depth of the contact hole connecting the first interconnecting layer to the surface of the semiconductor substrate and thereby decreases the aspect ratio of this contact hole. This facilitates processing and filling this contact hole and allows micropatterning.

4 Claims, 2 Drawing Sheets

SEMICONDUCTOR MEMORY HAVING CELL INCLUDING TRANSISTOR AND FERROELECTRIC CAPACITOR

BACKGROUND OF THE INVENTION

The present invention relates to a semiconductor memory and a method of fabricating the same and, more particularly, to a ferroelectric random access memory (to be referred to as an FRAM hereinafter) and a method of fabricating the same.

FRAM products or FRAM hybrid logic products have a cell circuit configuration as shown in FIG. 4. Each cell has one transistor Tr and one capacitor C. One of source and drain diffusion layers of the transistor Tr is connected to one end of the capacitor C. The other one of the source and drain diffusion layers of the transistor Tr is connected to a bit line BL. The gate of the transistor Tr is connected to a word line WL. The other end of the capacitor C is connected to a plate line PL.

FIG. 3 shows the cell structure of this FRAM, which is pertinent to the present invention. The surface of a semiconductor substrate 71 is divided into a cell region and a peripheral circuit region. A drain diffusion layer 73 and a source diffusion layer 74 are formed in the cell region. A drain diffusion layer 76 and a source diffusion layer 77 are formed in the peripheral circuit region. Gate electrodes 72 and 75 are formed on the semiconductor substrate 71 via a gate oxide film. A BPSG film 78 is formed on these gate electrodes 72 and 75 to planarize their surfaces. On the surface of this BPSG film 78, a silicon nitride film 79 and a silicon oxide film 80 as barrier layers are formed.

On the surface of the silicon oxide film 80, a lower electrode 81, a dielectric film 82, and an upper electrode 83 are formed in this order to construct an FRAM capacitor. An insulating film 84 made from TEOS or the like is formed on the surfaces of this capacitor and a silicon oxide film 80 to planarize these surfaces.

The gate electrode 72 of the transistor Tr in the cell region is connected to the word line WL (not shown) formed on the insulating film 84 via a contact hole filled with a refractory metal such as titanium or tungsten. The drain diffusion layer 73 is connected to the bit line BL (not shown) formed on the insulating film 84 via a contact hole similarly filled with a refractory metal. The source diffusion layer 74 is connected to the upper electrode 83 of the capacitor via a refractory metal film filling a contact hole 85 and a first interconnecting layer 88. The lower electrode 81 is connected to the plate line PL (not shown).

Contact holes are formed in the BPSG film 78, the silicon nitride film 79, the silicon oxide film 80, and the insulating layer 84 to expose the surfaces of the source diffusion layers 74 and 77. A refractory metal film 85 such as titanium or tungsten fills these contact holes. Also, a contact hole is formed in the insulating layer 84 to expose the surface of the upper electrode 83. A refractory metal film 87 is formed on the inner surfaces of this contact hole.

The first interconnecting layer 88 made of aluminum or the like is formed on the surface of the insulating layer 84 and connected to the upper electrode 83. This interconnecting layer 88 is also connected to the source diffusion layers 74 and 77 via the refractory metal films 85 and 87 filling the contact holes 85.

An insulating film 89 is formed on the surfaces of the interconnecting layer 88 and the insulating layer 84 to planarize these surfaces. A second interconnecting layer 92 is formed on the surface of this insulating film 89. The first and second interconnecting layers 88 and 92 are connected via contact holes 91. A passivation film 93 covers the surfaces of the interconnecting layer 92 and the insulating layer 89.

However, a semiconductor memory with the above structure has the following problem. As shown in FIG. 3, the contact hole for connecting the first interconnecting layer 88 to the source diffusion layer 74 on the surface of the semiconductor substrate 71 must be so formed as to have a depth equivalent to the total film thickness of the BPSG film 78, the silicon nitride film 79, the silicon oxide film 80, and the insulating layer 84. Therefore, the aspect ratio of the depth to the opening diameter of the contact hole increases to make the contact hole difficult to process and fill.

If the surface of the insulating layer 84 covering the FRAM capacitor is not planarized, the film thickness of this insulating layer 84 can be decreased, so the depth of the contact hole can also be decreased. In this case, however, the first interconnecting layer 88 formed on the insulating layer 84 is not planarized. This makes lithography and etching for pattering the interconnecting layer 88 difficult to perform.

As described above, the memory shown in FIG. 3 has the problem that when an interconnecting layer is planarized, a contact hole connecting this interconnecting layer to the surface of a semiconductor substrate is deepened and made difficult to process and fill, so no micropatterning can be realized.

SUMMARY OF THE INVENTION

It is an object of the present invention to provide a semiconductor memory which facilitates processing an interconnecting layer and processing and filling a contact hole connecting this interconnecting layer to a semiconductor substrate and can realize micropatterning, and a method of fabricating the same.

According to the present invention, there is provided a semiconductor memory having a cell including a transistor and a ferroelectric capacitor, comprising the ferroelectric capacitor formed on a surface of a semiconductor substrate via a first insulating layer, a first interconnecting layer formed on a surface of a second insulating layer so formed as to cover the ferroelectric capacitor, and a second interconnecting layer formed on a surface of a third insulating layer so formed as to cover the first interconnecting layer, and directly connected to an upper electrode of the ferroelectric capacitor via a contact hole formed in the second and third insulating layers.

In this semiconductor memory, the first interconnecting layer is formed below the second interconnecting layer directly connected to the upper electrode of the ferroelectric capacitor. This facilitates processing and planarizing the first interconnecting layer as the lower layer.

A third interconnecting layer may be formed inside the first insulating layer.

Also, the upper electrode of the capacitor and a diffusion layer of the transistor may be connected via the third interconnecting layer.

In this semiconductor memory, the first interconnecting layer is formed after the formation of the ferroelectric capacitor. This eliminates the problem that, e.g., the interconnecting material is melted by annealing in the ferroelectric capacitor formation step. Therefore, it is unnecessary to use a refractory metal as the interconnecting material and possible to use a low-resistance material, such as aluminum, as the interconnection. Also, the first contact hole can be easily processed and filled, and this contributes to micropatterning.

Furthermore, at least one of the first and second interconnecting layers may be made of a material containing at least one of aluminum and copper.

This semiconductor memory achieves micropatterning because the first contact hole can be easily processed and filled and the first interconnecting layer and the ferroelectric capacitor can be so formed as to vertically overlap each other via the insulating film.

The semiconductor memory fabrication method of the present invention is a method of fabricating a semiconductor memory having a cell including a transistor and a ferroelectric capacitor, comprising the steps of forming a first insulating layer on a surface of a semiconductor substrate, forming a ferroelectric capacitor on the first insulating layer, forming a second insulating film to cover the ferroelectric capacitor, forming a first interconnecting layer on the second insulating film, forming a third insulating film on the first interconnecting layer, forming a contact hole in the third and second insulating films to expose an upper electrode of the ferroelectric capacitor, and forming a second interconnecting layer on the third insulating film.

The first insulating layer formation step may comprise two or more insulating layer deposition steps, and the method may further comprise the step of forming a third interconnecting layer inside the first insulating layer.

The material of at least one of the first and second interconnecting layers may contain one of aluminum and copper.

DESCRIPTION OF THE PREFERRED EMBODIMENTS

One embodiment of the present invention will be described below with reference to the accompanying drawings.

The method of fabricating a semiconductor memory according to the first embodiment of the present invention will be described below with reference to FIGS. 1A to 1E showing longitudinal sections of elements. The arrangement of this semiconductor memory will be described by using FIG. 1E.

Figure 1A:
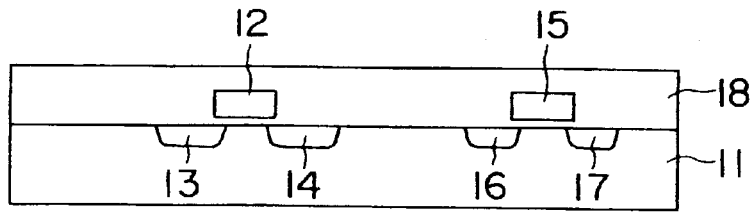
FIGS. 1A to 1E are longitudinal sectional views of elements showing the steps in the method of fabricating a semiconductor memory according to the first embodiment of the present invention.

As shown in FIGS. 1A to 1E, the surface of a semiconductor substrate 11 is divided into a cell region and a peripheral circuit region. First, as shown in FIG. 1A, an impurity is ion-implanted to form a drain diffusion layer 13 and a source diffusion layer 14 in the cell region and a drain diffusion layer 16 and a source diffusion layer 17 in the peripheral circuit region. Gate electrodes 12 and 15 are formed on the semiconductor substrate 11 via a gate oxide film.

On these gate electrodes 12 and 15, a BPSG film 18 about 1,800 nm thick is deposited as a first insulating interlayer by LPCVD (Low Pressure Chemical Vapor Deposition). The surface of this BPSG film 18 is planarized by CMP (Chemical Mechanical Polishing) to decrease the film thickness to about 1,000 nm. On the surface of this BPSG film 18, a silicon nitride film 19 about 150 nm thick is formed by LPCVD. On the surface of this silicon nitride film 19, a silicon oxide film 20 about 200 nm thick is formed by LPCVD, plasma CVD, or atmospheric pressure CVD.

The silicon nitride film 19 is formed as a barrier layer to prevent the characteristics of the transistors from being varied by annealing performed in the oxygen ambient in the FRAM capacitor formation step, which will be described later.

Figure 1B:
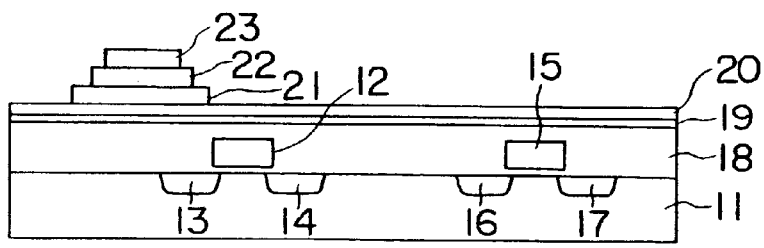

As shown in FIG. 1B, titanium (Ti) and platinum (Pt) are vapor-deposited in order on the surface of the silicon oxide film 20 by sputtering. A PZT film made from lead zirconate titanate is formed on the surface, and platinum is vapor-deposited on the surface of this PZT film by sputtering. These films are patterned by reactive ion etching (to be referred to as RIE hereinafter) downward from the uppermost film to form an upper electrode 23, a ferroelectric film 22 as a capacitor insulating film, and a lower electrode 21, thereby constructing an FRAM capacitor. If the ferroelectric film 22 is damaged to change its original characteristics, the characteristics can be recovered by performing annealing in an oxygen ambient at about 500° C. to 650° C. Also, an SBT film made from strontium, bismuth, and titanium may be formed instead of the PZT film.

Figure 1C:
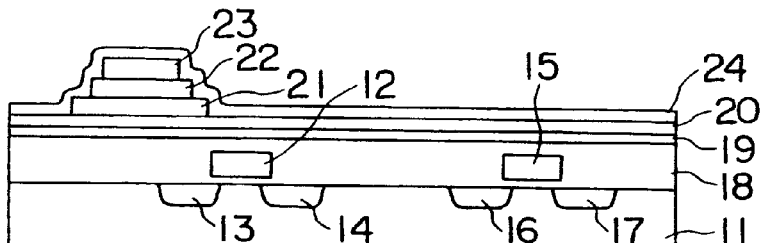

As shown in FIG. 1C, a d-TEOS film 24, for example, is formed to cover the entire surface as a second insulating interlayer by plasma CVD. The film thickness of this d-TEOS film 24 can be about, e.g., 200 to 300 nm which is smaller than the total film thickness of the capacitor. If the film thickness of the d-TEOS film 24 is too large, contact holes to be formed later undesirably become too deep. If the film thickness of the d-TEOS film 24 is too small, the d-TEOS film 24 is etched away when an interconnecting layer to be formed on the surface of this film 24 is patterned, and hence does not function as a capacitor protective film any longer. Accordingly, the film thickness of the d-TEOS film 24 is so set that the film 24 functions as a capacitor protective film and is not thicker than needed.

Figure 1D:
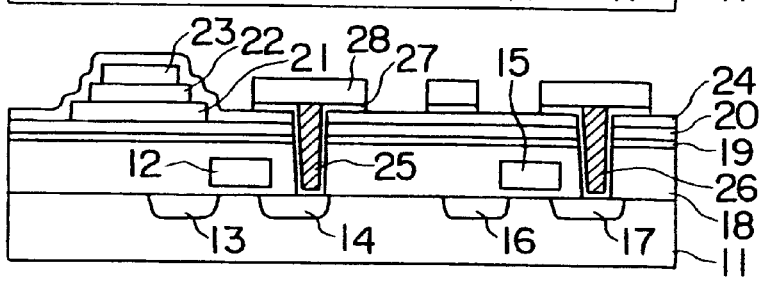

After patterning is performed by photolithography, as shown in FIG. 1D, RIE is used to form contact holes 25 and 26 which extend through the BPSG film 18, the silicon nitride film 19, the silicon oxide film 20, and the d-TEOS film 24 to expose the surfaces of the source diffusion layers 14 and 17 on the surface of the semiconductor substrate 11. A 40-nm thick Ti film is formed to cover the entire surface by sputtering, and a 60-nm thick TiN film 27 is also formed. A refractory metal such as tungsten is buried in the contact holes 25 and 26 by CVD. The refractory metal such as tungsten used as a contact filling material in regions except for the contact holes 25 and 26 is removed by etching back. The underlying Ti and TiN films are not removed.

Figure 3:
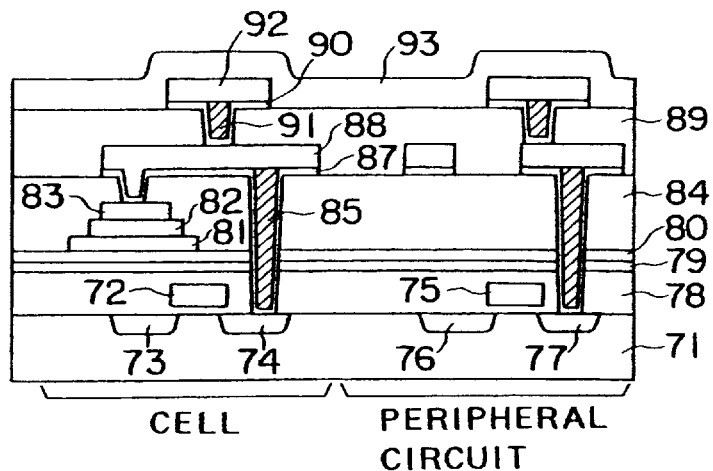
FIG. 3 is a longitudinal sectional view of elements showing the steps in the method of fabricating a semiconductor device relevant to the present invention.
Figure 4:
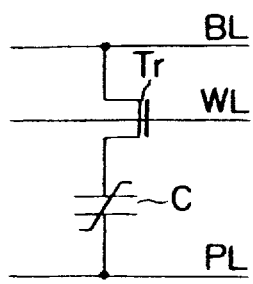
FIG. 4 is a circuit diagram showing the configuration of a cell of a semiconductor memory to which the present invention is applicable.

A 400-nm thick AlCu film is deposited on the entire surface by sputtering and patterned into the shape of an interconnection together with the Ti film and the TiN film 27, thereby forming a first interconnecting layer 28. In the aforementioned semiconductor memory shown in FIG. 3, the first interconnecting layer 88 is formed on the surface of the insulating interlayer 84 on the capacitor. In this embodiment, however, the first interconnecting layer 28 is formed on the surface of the d-TEOS film 24 at substantially the same level as the capacitor. Therefore, in this embodiment, an interconnecting layer can be formed with a short length on a flat film. This eliminates the problem of lithography and facilitates the processing of patterning. The above process for burying the contact holes can be carried out using Aluminum instead of Tungsten. In this case, Al is reflowed at high temperature so as to bury the contact holes. In addition, the process for burying the contact holes in this case can be performed simultaneously with the process for forming the Al interconnecting layer.

When an interconnecting layer is formed on the surface of a film having a step, the thickness of the film to be etched becomes effectively larger on the step than in a flat portion. Hence, etching must be performed for a longer time period. However, if the etching time is long, the underlying film may be removed by etching. This embodiment can avoid this problem because the interconnecting layer 28 is formed on the flat d-TEOS film 24.

Figure 1E:
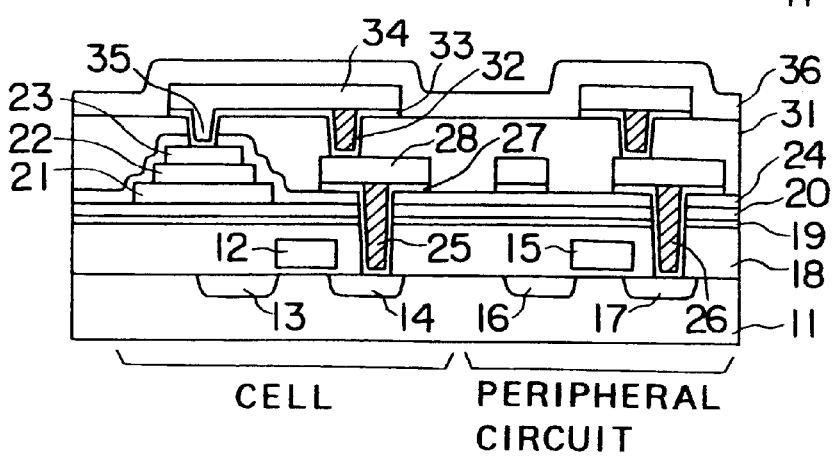

As shown in FIG. 1E, a TEOS film 31 is deposited to cover the capacitor and the first interconnecting layer 28 by plasma CVD. This TEOS film 31 is planarized by CMP to form a third insulating interlayer having a film thickness of 1,200 nm. A contact hole 32 is formed in the TEOS film 31 to expose the surface of the first interconnecting layer 28.

A 70-nm thick TiN film 33 is deposited to cover the surface of the TEOS film 31 and the inner surfaces of the contact hole 32 by sputtering or CVD. A refractory metal such as tungsten (W) is deposited and buried in the contact hole 32. After that, etching back is performed to remove the contact filling metal such as W in regions except for the contact hole and the metal such as TiN covering the contact side walls.

Additionally, a contact hole 35 is formed in the TEOS film 31 and the d-TEOS film 24 to expose the surface of the upper electrode 23. This contact hole 35 can also be formed and filled with a refractory metal simultaneously with the contact hole 32. In this embodiment, however, the contact hole 35 is formed after the formation of the contact hole 32 for the following reasons.

That is, the aspect ratio of the contact hole 35 for making contact with the upper electrode 23 is smaller than that of the contact hole 32. Hence, the necessity to bury a refractory metal in this contact hole 35 is small. Also, it is difficult to fill the contact hole 32 under the same conditions simultaneously when the contact hole 35 having a largely different aspect ratio is filled. Furthermore, the contact hole 35 is not preferably filled so as to prevent the capacitor from damage by filling.

Next, a 70-nm thick TiN film 33 is deposited by sputtering or CVD. A 600-nm thick AlCu film 34 is deposited and patterned into the shape of an interconnection to form a second interconnecting layer. Consequently, a capacitor electrode interconnection connecting a capacitor contact plug to the upper electrode 23 is formed. The above process for burying the contact holes can be carried out using Aluminum instead of Tungsten. In this case, Al is reflowed at high temperature so as to bury the contact holes. In addition, the process for burying the contact holes in this case can be performed simultaneously with the process for forming the Al interconnecting layer.

After that, a passivation film 36 is formed to cover the entire surface, and a pad (not shown) is formed. To fabricate a device having three layers or more, the same steps are repeated to form interconnecting layers, insulating interlayers, passivation films, and pads.

The gate electrode 12 of a transistor Tr in the cell region is connected to a word line WL (not shown) via a contact filled with a refractory metal. The drain diffusion layer 13 is connected to a bit line BL (not shown) via a contact filled with a refractory metal. This bit line can be formed by either the first or second interconnecting layer. The source diffusion layer 14 is connected to the upper electrode 23 of the capacitor via the refractory metal film filling the contact hole 25, the first interconnecting layer 28, the refractory metal filling the contact hole 32, the second interconnecting layer 34, and the interconnecting material filling the contact hole 35. The lower electrode 21 is connected to a plate line PL (not shown).

The semiconductor memory according to this embodiment obtained through the above steps has the following characteristic features. In the device shown in FIG. 3, the upper electrode 83 of the FRAM capacitor is connected to the source diffusion layer 74 on the surface of the semiconductor substrate 71 via the first interconnecting layer 88. This first interconnecting layer 88 is formed on the insulating layer 84 which is so formed as to cover the FRAM capacitor, i.e., the first interconnecting layer 88 is formed at a different level from that of the FRAM capacitor. As described above, this greatly increases the depth of the contact hole 85 for connecting the first interconnecting layer 88 to the surface of the semiconductor substrate 71 and thereby makes this contact hole difficult to form and fill.

In this embodiment, however, the upper electrode 23 of the FRAM capacitor and the source diffusion layer 14 on the surface of the semiconductor substrate 11 are connected via not only the first interconnecting layer 28 but also the second interconnecting layer 34. Also, the first interconnecting layer 28 is formed on the d-TEOS film 24, i.e., formed at substantially the same level as the FRAM capacitor. This decreases the depth of the contact hole 25 for connecting the first interconnecting layer 28 to the surface of the semiconductor substrate 11 and hence decreases the aspect ratio of this contact hole. Accordingly, the contact hole is easily formed and filled. This is particularly advantageous in FRAM hybrid logic products requiring severe micropatterning.

Additionally, this embodiment achieves the following effect because the first and second interconnecting layers 28 and 34 are formed after the formation of the FRAM capacitor. In the step of forming the FRAM capacitor, as described above, if the ferroelectric film 22 is damaged, annealing must be performed to recover this ferroelectric film 22 in an oxygen ambient at 500° C. to 650° C. If the first interconnecting layer is formed before this annealing, a refractory metal such as tungsten must be used because a low-melting metal such as aluminum melts during the annealing. However, a refractory metal such as tungsten generally has a higher resistance than that of aluminum. Therefore, problems such as decreases in the signal transmission rate readily arise.

In this embodiment, however, the first and second interconnecting layers 28 and 34 are formed after the formation of the FRAM capacitor and hence are not influenced by the annealing of the capacitor. Accordingly, all the interconnecting layers can be formed by a low-resistance interconnecting material such as aluminum, and this contributes to improvements of the device characteristics.

Figure 2:
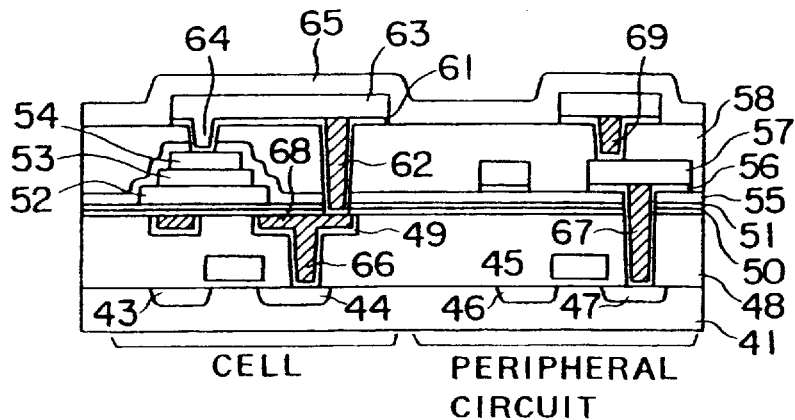
FIG. 2 is a longitudinal sectional view of elements showing the steps in the method of fabricating a semiconductor device according to the second embodiment of the present invention.

The semiconductor memory according to the second embodiment of the present invention has a sectional structure as shown in FIG. 2. on the surface of a semiconductor substrate 41, a drain diffusion layer 43 and a source diffusion layer 44 are formed in a cell region, and a drain diffusion layer 46 and a source diffusion layer 47 are formed in a peripheral circuit region. Gate electrodes 42 and 45 are formed on the surface of the semiconductor substrate 41 via a gate oxide film (not shown). A BPSG film 48 is formed to cover the semiconductor substrate 41 and the gate electrodes 42 and 45.

In the cell region, a contact hole 66 is formed in the BPSG film 48 to expose the surface of the drain diffusion layer 44. After that, a region where a first interconnecting layer is to be formed is removed by etching. After the surface of the BPSG film 48 is covered with a titanium film 49, a refractory metal such as tungsten is buried to form an interconnecting layer 68 by dual damascene. Consequently, the source diffusion layer 44 on the surface of the semiconductor substrate 41 is connected to the first interconnecting layer 68 via the contact hole.

A silicon nitride film 50 and a silicon oxide film 51 are formed to cover the entire surfaces of the BPSG film 48 and the interconnecting layer 68. On the silicon oxide film 51 in the cell region, a lower electrode 52, a ferroelectric film 53, and an upper electrode 54 are formed to construct an FRAM capacitor. A d-TEOS film 55 is formed to cover this capacitor and the silicon oxide film 51. In the peripheral circuit region, a Ti film, a TiN film 56, and an AlCu film 57 are formed to construct the first interconnecting layer 58. In the cell region, a contact hole 62 for connection to the first interconnecting layer 68 is formed, and a contact hole 64 for connection to the upper electrode 54 is formed. In the peripheral circuit region, a contact hole 69 for connection to the first interconnecting layer 57 is formed. A TiN film 61 is formed in these contact holes 62, 64, and 69, and a refractory metal is buried in the contact holes 62 and 69. The second interconnecting layer 63 is formed on the TEOS film 68, and a passivation film 65 is formed to cover the entire surface.

In the abovementioned first embodiment, the first interconnecting layer 28 is formed at substantially the same level as the FRAM capacitor in both the cell region and the peripheral region. In the cell region, the upper electrode 23 of the FRAM capacitor and the surface of the semiconductor substrate 11 are connected via the second interconnecting layer 34 and the first interconnecting layer 28.

In this second embodiment, however, although the first interconnecting layer 57 is formed at substantially the same level as the FRAM capacitor in the peripheral circuit region, the tungsten interconnecting layer 68 is formed at a lower level than the FRAM capacitor in the cell region. The upper electrode 54 and the source diffusion layer 44 are connected via this interconnecting layer 68, the contact hole 66, the second interconnecting layer 63, and the contact holes 64 and 62.

In this second embodiment, as in the first embodiment described above, the aspect ratio of the contact hole 62 for connecting the second interconnecting layer 63 to the first interconnecting layer 49 is lower than that of the conventional contact holes. Accordingly, it is possible to readily form and fill the contact hole and meet the demand for micropatterning.

Also, in this embodiment, the first interconnecting layer 68 is formed earlier than the FRAM capacitor. Therefore, this interconnecting layer 68 must be made of a refractory metal so as not to be oxidized by the influence of annealing performed for the ferroelectric film 53 in the oxygen ambient. This increases the interconnecting resistance compared to the first embodiment. However, in the cell region, the first interconnecting layer 68 and the FRAM capacitor can be so arranged as to vertically overlap each other. This contributes to a reduction in cell area. In the cell region, the demand for a reduction in cell area is greater than for the operating speed compared to the peripheral circuit region. Hence, the cell area reducing effect is useful in actual products.

The aforementioned embodiments are merely examples and do not restrict the present invention. For example, the materials and formation methods of the individual interconnecting layers and insulating layers are examples, so these layers can also be formed by using other materials and other methods.

What is claimed is:

1. A semiconductor memory having a cell including a transistor and a ferroelectric capacitor, comprising:

said ferroelectric capacitor formed on a surface of a first insulating layer formed on a surface of a semiconductor substrate;

a first interconnecting layer formed on a surface of a second insulating layer so formed as to cover said ferroelectric capacitor and connected to a diffusion layer of said transistor formed in a surface portion of the semiconductor substrate via a first contact hole formed in said first and second insulating layers; and a second interconnecting layer formed on a surface of a third insulating layer so formed as to cover said first interconnecting layer, connected to an upper electrode of said ferroelectric capacitor via a second contact hole formed in said second and third insulating layers, and connected to said first interconnecting layer via a third contact hole formed in said third insulating layer.

2. A memory according to claim 1, wherein at least one of said first and second interconnecting layers is made of a material containing at least one of aluminum and copper.

3. A memory according to claim 2, where at least one of said first and second interconnecting layers is made of a material containing at least one of aluminum and copper.

4. A semiconductor memory having a cell including a transistor and a ferroelectric capacitor, comprising:

a first interconnecting layer formed in a surface portion of a first insulating layer formed on a surface of a semiconductor substrate, connected to a diffusion layer of said transistor formed in a surface portion of the semiconductor substrate via a first contact hole formed in said first insulating layer;

said ferroelectric capacitor formed on a surface of the first insulating layer; and a second interconnecting layer formed on a surface of a second insulating layer so formed as to cover said ferroelectric capacitor, connected to an upper electrode of said ferroelectric capacitor via a second contact hole formed in said second insulating layer, and connected to said first interconnecting layer via a third contact hole formed in a third insulating layer.

* * * * *

UNITED STATES PATENT AND TRADEMARK OFFICE
CERTIFICATE OF CORRECTION

PATENT NO.    : 6,313,491 B1
DATED         : November 6, 2001
INVENTOR(S)   : Susumu Shuto It is certified that error appears in the above-identified patent and that said Letters Patent is hereby corrected as shown below:

Title page,
Item [56], References Cited "King" has been replaced with -- Xing --

Column 8,
Line 41, "claim 2" has been replaced with -- claim 4 --

Signed and Sealed this

Tenth Day of September, 2002

Attest:

Attesting Officer

JAMES E. ROGAN
*Director of the United States Patent and Trademark Office*